(12) United States Patent
Kurita (10) Patent No.: US 9,472,903 B2
(45) Date of Patent: Oct. 18, 2016

(54) GRIP MEMBER

(71) Applicant: KITAGAWA INDUSTRIES CO., LTD., Aichi (JP)

(72) Inventor: Tomohisa Kurita, Aichi (JP)

(73) Assignee: KITAGAWA INDUSTRIES CO., LTD., Aichi (JP)

( * ) Notice: Subject to any disclaimer, the term of this patent is extended or adjusted under 35 U.S.C. 154(b) by 0 days.

(21) Appl. No.: 14/889,100

(22) PCT Filed: Mar. 20, 2014

(86) PCT No.: PCT/JP2014/057818
§ 371 (c)(1),
(2) Date: Nov. 4, 2015

(87) PCT Pub. No.: WO2014/208153
PCT Pub. Date: Dec. 31, 2014

(65) Prior Publication Data
US 2016/0099525 A1 Apr. 7, 2016

(30) Foreign Application Priority Data

Jun. 28, 2013 (JP) .................................. 2013-136716

(51) Int. Cl.
*H01R 12/00* (2006.01)
*H01R 13/6582* (2011.01)
(Continued)

(52) U.S. Cl.
CPC ........ *H01R 13/6582* (2013.01); *H01R 4/4881* (2013.01); *H01R 12/57* (2013.01); *H05K 9/0035* (2013.01); *F16B 5/0614* (2013.01); *H01R 12/718* (2013.01); *H01R 13/6594* (2013.01)

(58) Field of Classification Search
CPC .. H01R 4/4881; H01R 12/57; H01R 12/718; H01R 13/6582; H01R 13/6594; H05K 9/0035; F16B 5/0614
USPC .......................................................... 439/83
See application file for complete search history.

(56) References Cited

U.S. PATENT DOCUMENTS

| 4,061,405 A * | 12/1977 | Minter ................. H01R 12/721 206/728 |
| 4,557,540 A * | 12/1985 | Forbes ................. H05K 7/1092 439/69 |
| 4,836,792 A * | 6/1989 | Glover .................. H01R 9/091 439/81 |

FOREIGN PATENT DOCUMENTS

| JP | 3020603 U | 6/1996 |
| JP | 2005-332953 A | 2/2005 |

OTHER PUBLICATIONS

Transmittal of the translation of the International Preliminary Report on Patentablilty and Written Opinion from Appl. No. PCT/JP2014/057818, dated Jan. 7, 2016.
(Continued)

*Primary Examiner* — Khiem Nguyen
(74) *Attorney, Agent, or Firm* — Koppel, Patrick, Heybl & Philpott (57) ABSTRACT

A grip member in one aspect of the present invention comprises a base portion and one or more pairs of grip portions. Of one and the other of the pair of grip portions, the one grip portion comprises a first spring portion and a second spring portion. The other grip portion comprises a third spring portion and a fourth spring portion. The second and fourth spring portions can grip the shield case by holding the shield case therebetween. The second and fourth spring portions are in contact with the shield case at different positions in regard to at least a direction orthogonal to the joint surface when the second and fourth spring portions grip the shield case.

13 Claims, 6 Drawing Sheets

(51) Int. Cl.
  *H01R 12/57*   (2011.01)
  *H05K 9/00*    (2006.01)
  *H01R 4/48*    (2006.01)
  *F16B 5/06*        (2006.01)
  *H01R 12/71*       (2011.01)
  *H01R 13/6594*     (2011.01)

(56) References Cited

OTHER PUBLICATIONS

Form PCT/ISA/210 International Search Report for PCT/JP2014/057818 dated May 13, 2014.

* cited by examiner

GRIP MEMBER

CROSS-REFERENCE TO RELATED APPLICATION

This international application claims priority from Japanese Patent Application No. 2013-136716 filed with the Japan Patent Office on Jun. 28, 2013, the entire content of which is incorporated herein by reference.

TECHNICAL FIELD

The present invention relates to a grip member configured to grip a shield case and electrically couple the shield case to a conductor portion of a printed wiring board when the shield case is soldered to a conductor portion of the printed wiring board to be disposed at a position where it can cover an electronic component on the printed wiring board.

BACKGROUND ART

As the grip member, for example, a grip member disclosed in Patent Document 1 below has been suggested. The grip member according to Patent Document 1 has a plurality of pairs of grip portions that face each other at positions between which a part of a shield case to be gripped is interposed.

PRIOR ART DOCUMENTS

Patent Documents

PATENT DOCUMENT 1: Japanese Unexamined Patent Application Publication No. 2005-332953

SUMMARY OF THE INVENTION

Problems to be Solved by the Invention

In the case of the grip member disclosed in Patent Document 1, however, each grip portion is in contact with the shield case at the position with the same height from the printed wiring board. Therefore, the part to be gripped does not bend even if that part is brought into press-contact with the grip member. Accordingly, the part to be gripped is maintained in a flat-plate shape. This is one reason why the shield case is easily pulled out of the grip member.

In one aspect of the present invention, therefore, a grip member with higher capability of gripping the shield case than the conventional grip member is desirably provided.

A grip member according to one aspect of the present invention comprises a base portion and one or more pairs of grip portions. The base portion comprises a joint surface to be soldered to a conductor portion that a printed wiring board has. Each of the one or more pairs of grip portions extends from the base portion and is configured to be elastically deformable. The one or more pairs of grip portions are configured, in a case that a plate-like portion as a part of a shield case is disposed perpendicular to the printed wiring board when the shield case is attached to a position where the shield case covers an electronic component mounted on the printed wiring board, to bring the plate-like portion into a state of being gripped by bringing at least one grip portion into press-contact with one surface of opposite surfaces of the plate-like portion and bringing at least one grip portion in press-contact with the other surface. Of one and the other of the pair of grip portions, the one grip portion comprises a first spring portion and a second spring portion. The first spring portion is formed into a shape that extends in a direction apart from the base portion ranging from a base end integrally formed on the base portion to a distal end. The second spring portion is formed into a shape that extends in a direction approaching the base portion ranging from a base end integrally formed on the first spring portion to the distal end and a shape that the part closer to the distal end is closer to the other grip portion. The other grip portion includes a third spring portion and a fourth spring portion. The third spring portion is formed into a shape that extends in a direction apart from the base portion ranging from a base end integrally formed on the base portion to the distal end. The fourth spring portion is formed into a shape that extends in a direction approaching the base portion ranging from a base end integrally formed on the third spring portion to the distal end and a shape that the part closer to the distal end is closer to the one grip portion. The second spring portion and the fourth spring portion are configured to have the shield case gripped by having the shield case held between the second spring portion and the fourth spring portion. The second spring portion and the fourth spring portion are configured to be in contact with the shield case at different positions in regard to at least a direction orthogonal to the joint surface when the shield case is gripped.

According to the grip member configured as above, the second spring portion and the fourth spring portion are in contact with the shield case at different positions in regard to at least a direction orthogonal to the joint surface. In other words, the contact area between the shield case and the second spring portion and the contact area between the shield case and the fourth spring portion are displaced in at least the direction orthogonal to the joint surface. In regard to the directions other than the direction orthogonal to the joint surface (for example, when the rectangular coordinate system is used and the direction orthogonal to the joint surface is the z-axis direction, the above directions correspond to the x-axis direction and the y-axis direction), the contact areas may or may not be displaced.

When the second spring portion and the fourth spring portion are brought into contact with the shield case at the positions displaced in the direction orthogonal to the joint surface, the plate-like portion is bent in a different direction at each position displaced in the direction orthogonal to the joint surface as compared to the case in which the second spring portion and the fourth spring portion are in contact with the shield case at the positions not displaced in the direction orthogonal to the joint surface. Therefore, the distortion as waving in the direction orthogonal to the joint surface easily occurs in the plate-like portion. Thus, the shield case is pulled out less easily from between the paired grip portions than in the case in which the shield case is gripped in the flat plate-like portion without the distortion. This can increase the operation of suppressing the displacement of the shield case.

If the shield case is provided with a hole in any one of the contact areas that are displaced in the direction orthogonal to the joint surface, it is possible to hook one spring portion of the second spring portion and the fourth spring portion in the hole of the shield case and to bring the other spring portion into press-contact with the plate-like portion of the shield case. Therefore, with the above structure, the operation of suppressing the displacement of the shield case can be further increased.

Moreover, in the case of this grip member, both the second spring portion and the fourth spring portion extend from their base ends in the direction where the spring portions approaches their respective base portions. The extension directions thereof are the directions where the parts closer to the ends thereof approaches to each other. Therefore, when the force acts upon the shield case held between the second spring portion and the fourth spring portion in the direction where the shield case is pulled out from between the both, a component of friction force acting between the shield case and each of the second spring portion and the fourth spring portion acts in the direction where the second spring portion and the fourth spring portion on both sides of the plate-like portion are attracted toward the plate-like portion.

Therefore, in the case where the shield case is displaced in a direction where the shield case is pulled out from between the paired grip portions, the press-contact force of the second spring portion and the fourth spring portion (i.e., the gripping force by the pair of grip portions) tends to increase. This can increase the operation of suppressing the displacement of the shield case.

By the way, in the above-described grip member, the second spring portion has a convex portion protruding in a direction close to the other grip portion. The convex portion may be configured to be brought into contact with the shield case when the shield case is gripped between the second spring portion and the fourth spring portion.

According to the grip member configured as above, the second spring portion is provided with the convex portion. The convex portion is in contact with the plate-like portion of the shield case. Therefore, as compared to the case in which the similar convex portion is not provided, the second spring portion can be bent more largely by the amount of protrusion of the convex portion. Thus, the elastic force generated in the second spring portion that has been largely deformed elastically as such concentrates on the convex portion. Accordingly, the convex portion is firmly brought into press-contact with the shield case. This can increase the operation of suppressing the displacement of the shield case.

In addition, in the above-mentioned grip member, when the shield case is gripped between the second spring portion and the fourth spring portion, the convex portion may be configured to be brought into contact with the shield case at a position more apart from the joint surface as compared to the contact position between the fourth spring portion and the shield case in regard to at least the direction orthogonal to the joint surface.

According to the grip member configured as above, the second spring portion with the convex portion is in contact at the position apart from the joint surface as compared to the fourth spring portion. As long as the plate-like portion of the shield case has uniform plate thickness, a part of the plate-like portion closer to the printed wiring board has lower bending rigidity as the part is separated from the ceiling of the shield case. As a result, the fourth spring portion is in contact with the area with the lower rigidity and the second spring portion with the convex portion is in contact with the area with the higher rigidity; thus, the higher press-contact force (gripping force) operates. This can increase the operation of suppressing the displacement of the shield case.

Moreover, in the above-mentioned grip member, the second spring portion and the fourth spring portion may have a part with larger length in a width direction, which is orthogonal to both an extension direction and a thickness direction, on a base end side than on the distal end side and a part with smaller length in the width direction on the distal end side than on the base end side, and the parts with the larger length in the width direction may be disposed to face each other with the plate-like portion interposed therebetween and the parts with the smaller length in the width direction are disposed not overlapping with each other when viewed from a direction perpendicular to the plate-like portion.

According to the grip member configured as above, the second spring portion and the fourth spring portion have parts that are narrow in the width direction. The parts are disposed not to overlap with each other when viewed from the direction perpendicular to the plate-like portion. Therefore, for example, even when the second spring portion and the fourth spring portion are molded by pressing, the second spring portion and the fourth spring portion can be bent largely without having the parts that are narrow in the width direction interfering with each other.

At the pressing, the second spring portion and the fourth spring portion can be bent somewhat excessively in consideration of the spring back quantity after the process. This makes it possible to set the initial position of the second spring portion and the fourth spring portion closer to the position of the plate-like portion. Thus, the press-contact force (gripping force) of the second spring portion and the fourth spring portion relative to the plate-like portion can be increased as compared to the case in which the distal ends of the second spring portion and the fourth spring portion are disposed overlapping with each other when viewed from the direction perpendicular to the plate-like portion. This can increase the operation of suppressing the displacement of the shield case.

Further, in the above-mentioned grip member, the second spring portion may be formed by cutting and raising a part of the first spring portion in a lingular shape, and the fourth spring portion may be formed by cutting and raising a part of the third spring portion in a lingular shape.

According to the grip member configured as above, the second spring portion and the fourth spring portion can be formed by a cutting and raising process. Therefore, the structure of the second spring portion and the fourth spring portion can be reduced in size as compared to the spring piece with the structure in which the extension piece extending upward from the base end is folded back obliquely downward in the middle. Additionally, the size of the entire grip member can be reduced further.

Furthermore, in the above-mentioned grip member, the distal end of the fourth spring portion may reach a position closer to the first spring portion than an intermediate position between the first spring portion and the third spring portion over the intermediate position in a state viewed from a direction parallel to both the plate-like portion and the printed wiring board.

According to the grip member configured as above, the distal end of the fourth spring portion reaches the position closer to the first spring portion than an intermediate position between the first spring portion and the third spring portion over the intermediate position. Therefore, the press-contact force of the fourth spring portion can be increased as compared to the case in which the distal end of the fourth spring portion is not present over the above intermediate position. This can increase the operation of suppressing the displacement of the shield case.

If the shield case is provided with a hole that allows the distal end of the fourth spring portion to be hooked therein, the distal end of the fourth spring portion is inserted into the hole more deeply. This makes it easier to hook the fourth spring portion. Thus, the operation of suppressing the displacement of the shield case can be increased further.

In the above grip member, the fourth spring portion may be configured to function as a stopper piece that prevents the shield case from being pulled out from between the paired grip portions by having the spring portion hooked in the hole of the shield case.

According to the grip member configured as above, hooking the distal end of the fourth spring portion in the hole of the shield case causes the fourth spring portion to function as the stopper piece. This prevents the shield case from being pulled out from between the paired grip portions. This can increase the operation of suppressing the displacement of the shield case.

BRIEF DESCRIPTION OF THE DRAWINGS

FIGS. 2A to 2D are diagrams illustrating the grip member of the embodiment, where

EXPLANATION OF REFERENCE NUMERALS

1: Grip member; 3: Base portion; 3A, 3B: Solder bonding portion; 3C: Floating portion; 5, 6: Grip portion; 11: First spring portion; 12: Second spring portion; 13: Third spring portion; 14: Fourth spring portion; 15: Convex portion; 21: Printed wiring board; 23: Shield case; 23A: Plate-like portion; 23B: Hole; and 25: Electronic component

MODE FOR CARRYING OUT THE INVENTION

An exemplary embodiment of the present invention is described next by way of example. In the description below, an up-down direction, a right-left direction, and a front-back direction are indicated with reference to the drawings as necessary. These directions are, however, merely determined to simply describe a relative positional relationship among portions included in a grip member. A direction of the grip member during an actual use may be determined arbitrarily.

[Structure Example of Grip Member]

Figure 1:
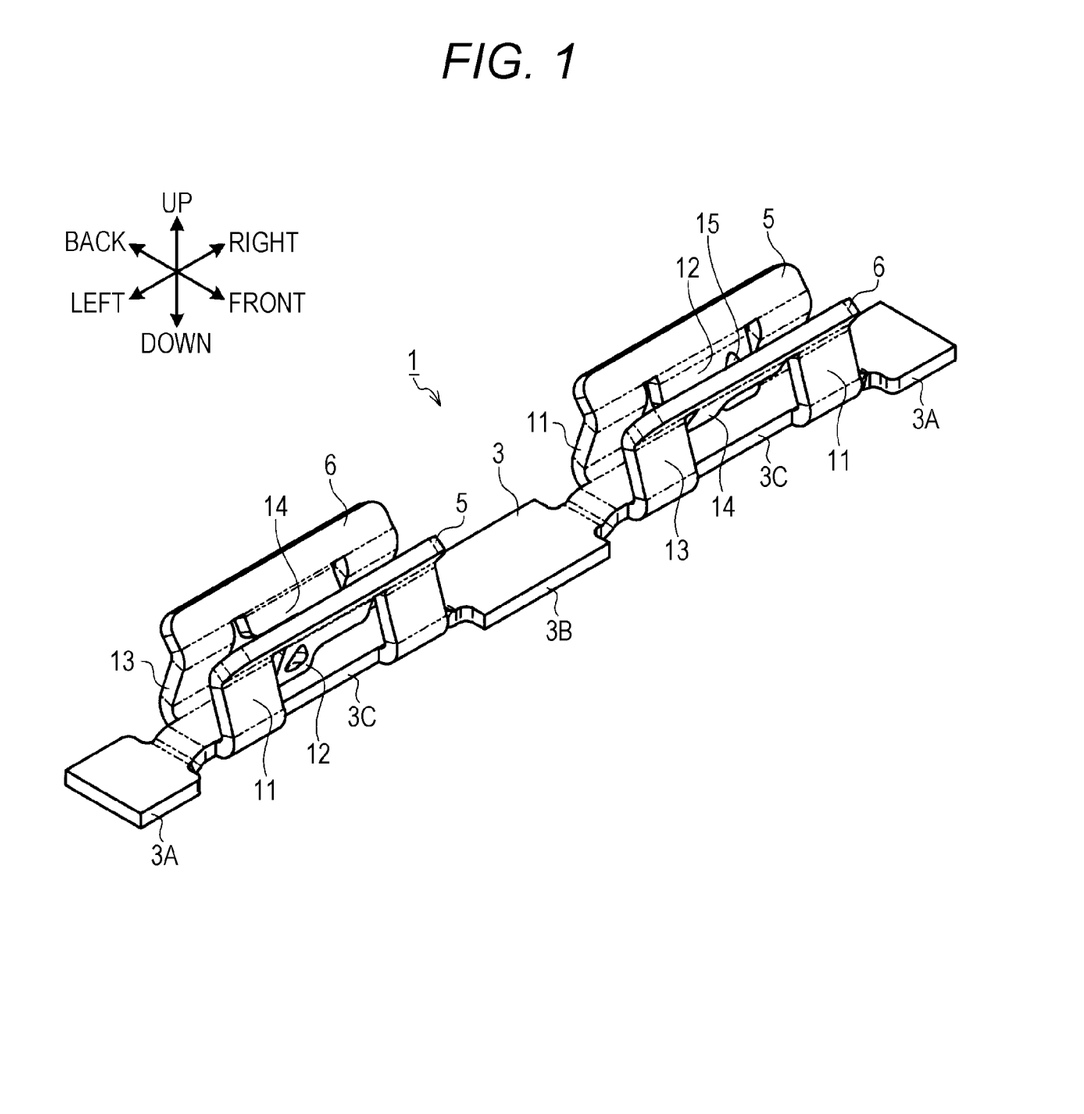
FIG. 1 is a perspective view illustrating a grip member of an embodiment.

A grip member 1 illustrated in FIG. 1 is formed by press working (punching or bending, for example) a metal thin plate (phosphor bronze for spring with a thickness of 0.1 mm in this embodiment). In this embodiment, a surface of the grip member 1 is plated with Cu and Sn.

Figure 2A:
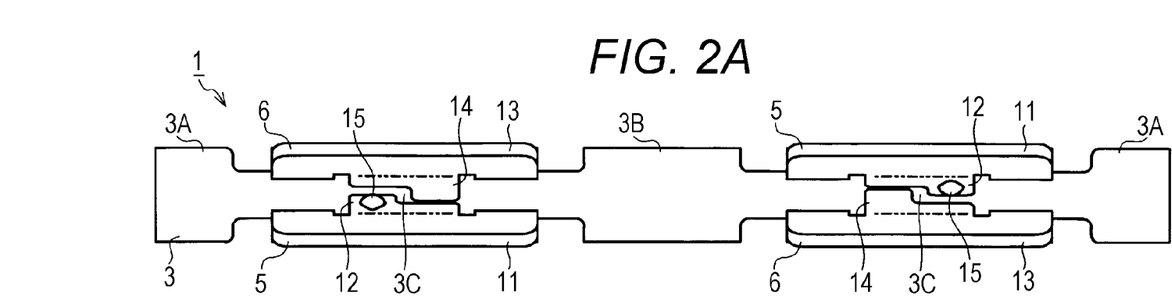
FIG. 2A is a plan view.

The grip member 1 comprises a base portion 3 and two pairs of grip portions 5, 6, 5 and 6 as a pair of grip portions 5 and 6 to be one pair. As is evident from FIG. 2A and FIG. 2C, the base portion 3 and the grip portions 5, 6, 5, and 6 have rotation-symmetric shapes, respectively, such that the shapes remain as they are even after a half turn (180-degree turn) about a vertical axial line extending in the up-down direction as a symmetric axis. In this embodiment, the grip member 1 indicated in FIG. 1 has a length of 6.5 mm in the right-left direction, a length of 0.8 mm in the up-down direction, and a length of 0.6 mm in the front-back direction.

Figure 2B:
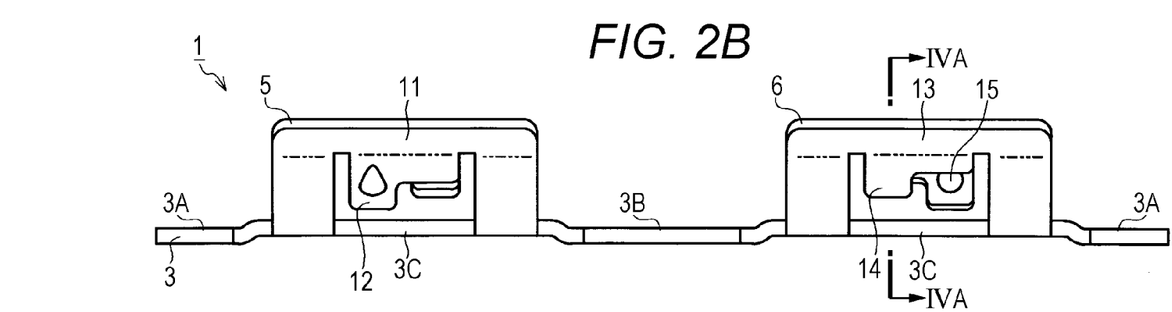
FIG. 2B is a front view.
Figure 2C:
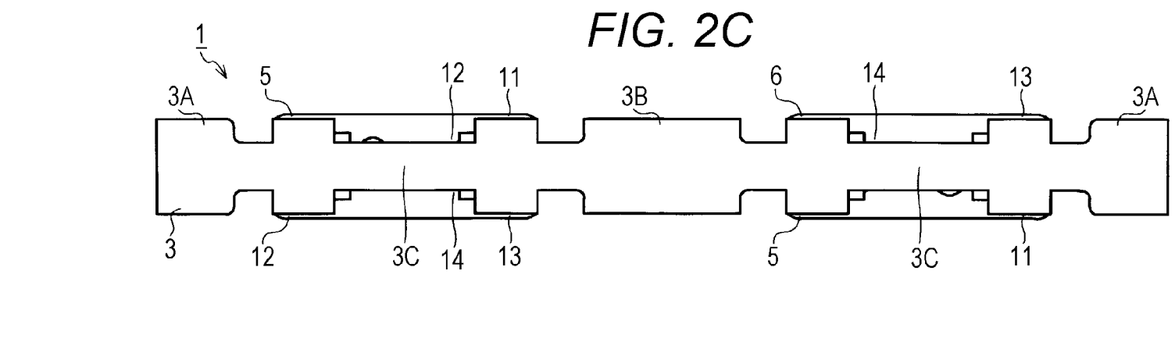
FIG. 2C is a bottom view.
Figure 2D:
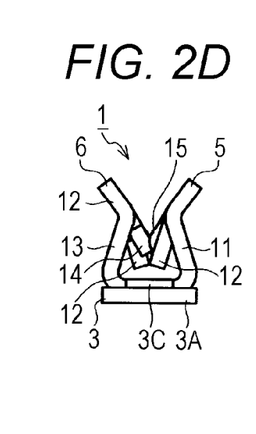
FIG. 2D is a right-side view.

The rear view is the same as the front view indicated in FIG. 2B. Further, the left-side view is the same as the right-side view indicated in FIG. 2D.

The base portion 3 is soldered to a printed wiring board and thus provided as a portion electrically coupled to a conductor portion of the printed wiring board. The base portion 3 comprises solder joint portions 3A, 3A, and 3B, and floating portions 3C and 3C. Under surfaces of the solder joint portions 3A, 3A, and 3B correspond to joint surfaces with the printed wiring board. An upper surface of the solder joint portion 3B corresponds to a suction surface that can be sucked by a suction nozzle (not shown) of an automatic mounting machine. Under the conditions that the solder joint portions 3A, 3A, and 3B are soldered to the printed wiring board, the floating portions 3C and 3C are portions in a state of forming a space from the printed wiring board. In this embodiment, under surfaces of the floating portions 3C and 3C are 0.05 mm above the under surfaces of the solder joint portions 3A, 3A, and 3B.

Of the pair of grip portions 5 and 6, one grip portion 5 comprises a first spring portion 11 and a second spring portion 12. The first spring portion 11 is shaped to extend upward from the base portion 3 as a base end to its distal end. The second spring portion 12 is shaped to extend obliquely downward from the first spring portion 11 as a base end to its distal end. The second spring portion 12 is formed by cutting and raising a part of the first spring portion 11 in a lingular shape.

The other grip portion 6 comprises a third spring portion 13 and a fourth spring portion 14. The third spring portion 13 is shaped to extend upward from the base portion 3 as a base end. The fourth spring portion 14 is shaped to extend obliquely downward from the third spring portion 13 as a base end to its distal end. The fourth spring portion 14 is formed by cutting and raising a part of the third spring portion 13 in a lingular shape.

An extension direction of the second spring portion 12 is determined so that the part closer to the distal end of the second spring portion 12 is closer to the other grip portion 6. An extension direction of the fourth spring portion 14 is determined so that the part closer to the distal end of the fourth spring portion 14 is closer to the grip portion 5. A spring length of the second spring portion 12 from the base end to the distal end is longer than a spring length of the fourth spring portion 14 from the base end to the distal end. The second spring portion 12 of the grip portion 5 is provided with a convex portion 15 that protrudes toward the grip portion 6.

In regard to a width direction that is orthogonal to both the extension direction and a thickness direction of the second spring portion 12 and the fourth spring portion 14, each of the second spring portion 12 and the fourth spring portion 14 comprises a part, on the base end side, that is longer in the width direction than on the distal end side. On the other hand, each of the second spring portion 12 and the fourth spring portion 14 comprises a part on the distal end side that is narrower in the width direction than on the base end side. The parts that are longer in the width direction are disposed to face each other with a position of a plate-like portion 23A interposed therebetween. The parts that are narrower in the width direction are disposed not to overlap with each other when viewed from a direction perpendicular to the plate-like portion 23A (see FIG. 2B).

[Usage Example of Grip Member (No. 1)]

Figure 3:
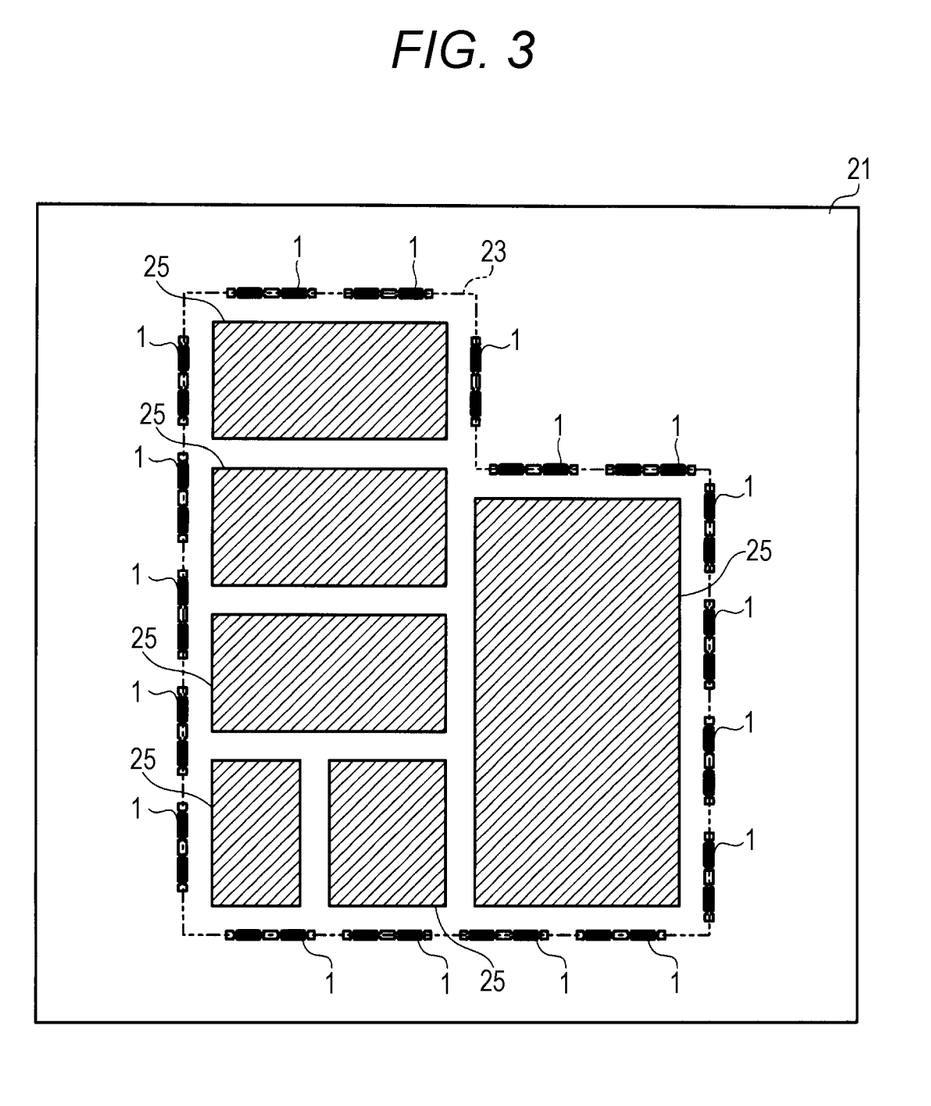
FIG. 3 is an explanatory view illustrating the usage of the grip member of the embodiment.

The grip member 1 configured as above is surface-mounted on a printed wiring board 21 as illustrated in FIG. 3. In this manner, the grip member 1 is used to attach a shield case 23 to the printed wiring board 21. The shield case 23 is a metal case attached to surround electronic components 25 in order to block the electromagnetic wave radiated from the electronic components 25 mounted on the printed wiring board 21 to the outside of the device and to block the electromagnetic wave that enters the electronic components 25 from outside the device.

FIG. 3 illustrates a position of the shield case 23 in plan view. The shield case 23 comprises a hexagonal ceiling as illustrated and a side wall portion vertically extended from a part of or all the sides of this ceiling. These ceiling and side wall portion are formed by press working a metal thin plate (stainless steel with a thickness of 0.1 mm in this embodiment).

The grip member 1 is surface-mounted together with the electronic components 25 at a position determined according to a shape and size of the shield case 23. On this occasion, the grip member 1 is disposed on the printed wiring board 21 by the automatic mounting machine (not shown). After the surface mount of the grip member 1, the shield case 23 is attached. When the shield case 23 is attached, a lower end of the shield case 23 is pressed against the grip member 1.

Figure 4A:
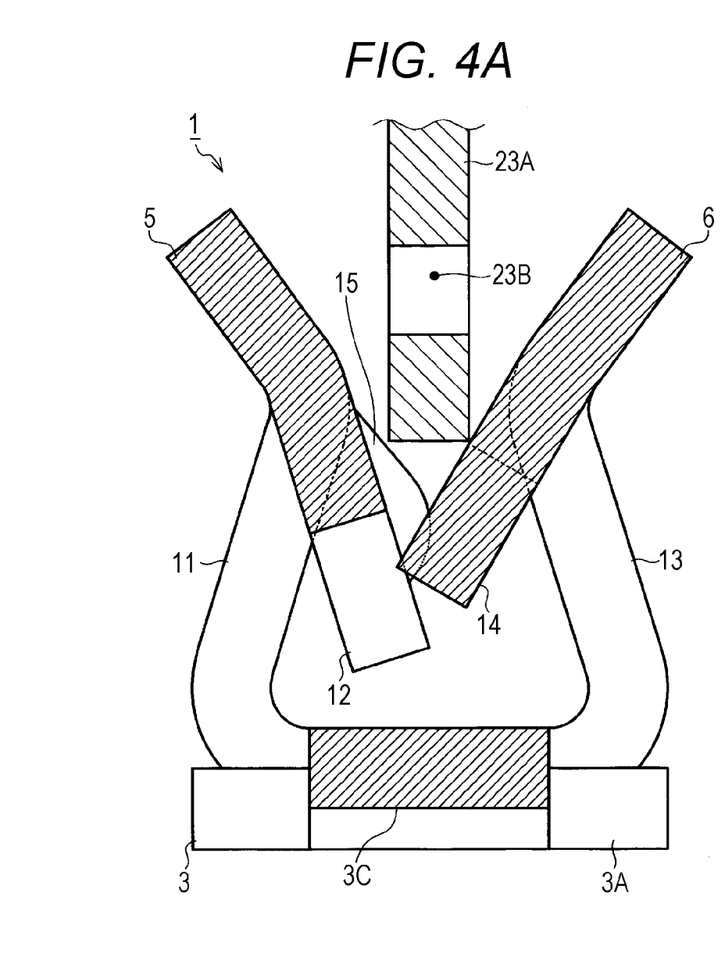
FIGS. 4A and 4B are explanatory diagrams illustrating the state in which the grip member of the embodiment is elastically deformed.
Figure 4B:
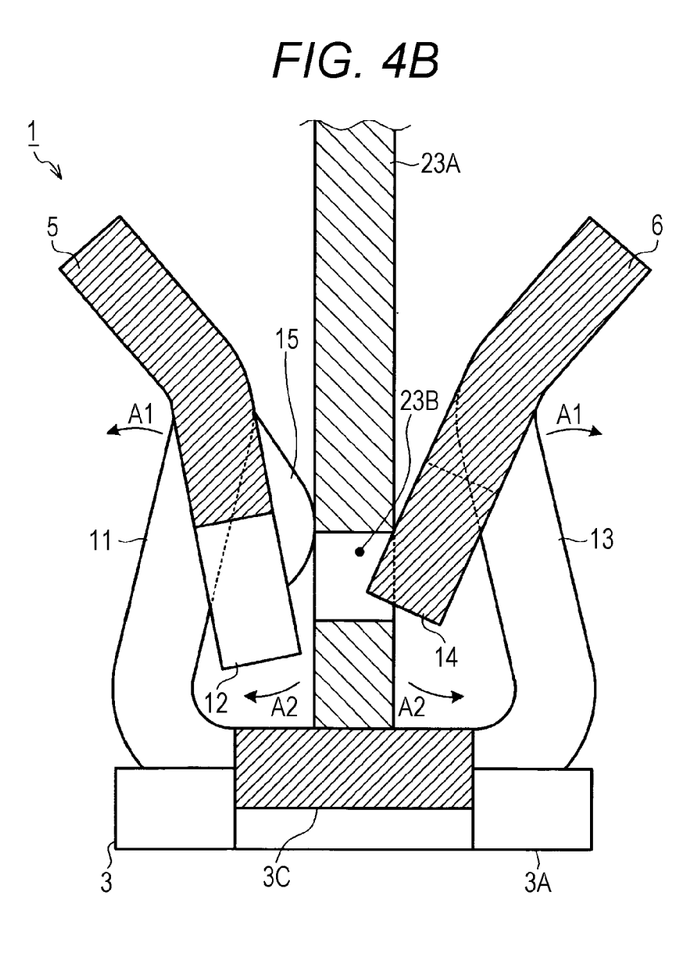

FIG. 4A and FIG. 4B are sectional views taken along a line IVA-IVA in FIG. 2B. The plate-like portion 23A is inserted between the grip portions 5 and 6 when the lower end of the shield case 23 is pressed against the grip member 1 to move the plate-like portion 23A of the side wall portion of the shield case 23 from a position illustrated in FIG. 4A to a position illustrated in FIG. 4B. Simultaneously, the grip portions 5 and 6 are elastically deformed and correspondingly displaced from the position illustrated in FIG. 4A to the position illustrated in FIG. 4B.

More specifically, in the grip portions 5 and 6, the first spring portion 11 and the third spring portion 13 are elastically deformed in directions where a space between their upper ends is expanded (directions indicated by A1 and A1 in FIG. 4B). On the other hand, the second spring portion 12 and the fourth spring portion 14 are elastically deformed in directions where a space between their lower ends is expanded (directions indicated by A2 and A2 in FIG. 4B).

In the case of this embodiment, the shield case 23 is provided with a hole 23B. When the shield case 23 is pushed in until the shield case 23 is brought into contact with the base portion 3 (floating portion 3C), the distal end of the fourth spring portion 14 is fitted into the hole 23B. Thus, the fourth spring portion 14 functions as a stopper piece that prevents the shield case 23 from being pulled out from between the grip portions 5 and 6 or an inhibitor piece that inhibits the shield case 23 from being pulled out from between the grip portions 5 and 6.

In particular, in this embodiment, the distal end of the fourth spring portion 14 reaches a position closer to the first spring portion 11 than an intermediate position between the first spring portion 11 and the third spring portion 13 over the intermediate position when viewed from a direction parallel to both the plate-like portion 23A and the printed wiring board 21. Thus, the distal end of the fourth spring portion 14 is inserted deeply into the hole 23B. As a result, an excellent stopping effect or inhibiting effect is achieved.

In such gripping state (the state illustrated by the solid line in FIG. 4B), the lower end of the plate-like portion 23A is in contact with the base portion 3. Therefore, even if a force that displaces the plate-like portion 23A downward operates, the plate-like portion 23A is not easily displaced downward. In addition, the first spring portion 11 and the third spring portion 13 suppress the downward displacement of the plate-like portion 23A. In other words, parts closer to the upper end of the first spring portion 11 and the third spring portion 13 are inclined to have a narrower space therebetween. If the force that displaces the plate-like portion 23A downward operates, part of the force acts in a direction where the space between the upper ends of the first spring portion 11 and the third spring portion 13 is reduced. This increases a press-contact force (gripping force) relative to the plate-like portion 23A. Thus, an operation that suppresses the downward displacement of the plate-like portion 23A is increased.

In the gripping state (the state illustrated by the solid line in FIG. 4B), the second spring portion 12 and the fourth spring portion 14 suppress an upward displacement of the plate-like portion 23A. In other words, parts closer to the lower ends of the second spring portion 12 and the fourth spring portion 14 are inclined to have a narrower space therebetween. If a force that displaces the plate-like portion 23A upward operates, part of the force acts in a direction where the space between the lower ends of the second spring portion 12 and the fourth spring portion 14 is reduced. This increases the press-contact force (gripping force) relative to the plate-like portion 23A. Thus, an operation that suppresses the upward displacement of the plate-like portion 23A is increased.

Note that the grip member 1 is soldered to the conductor portion with ground potential on the printed wiring board 21. Thus, the shield case 23 is electrically coupled to the conductor portion, so that the shield case 23 also serves as a portion with the ground potential.

[Usage Example of Grip Member (No. 2)]

Figure 5A:
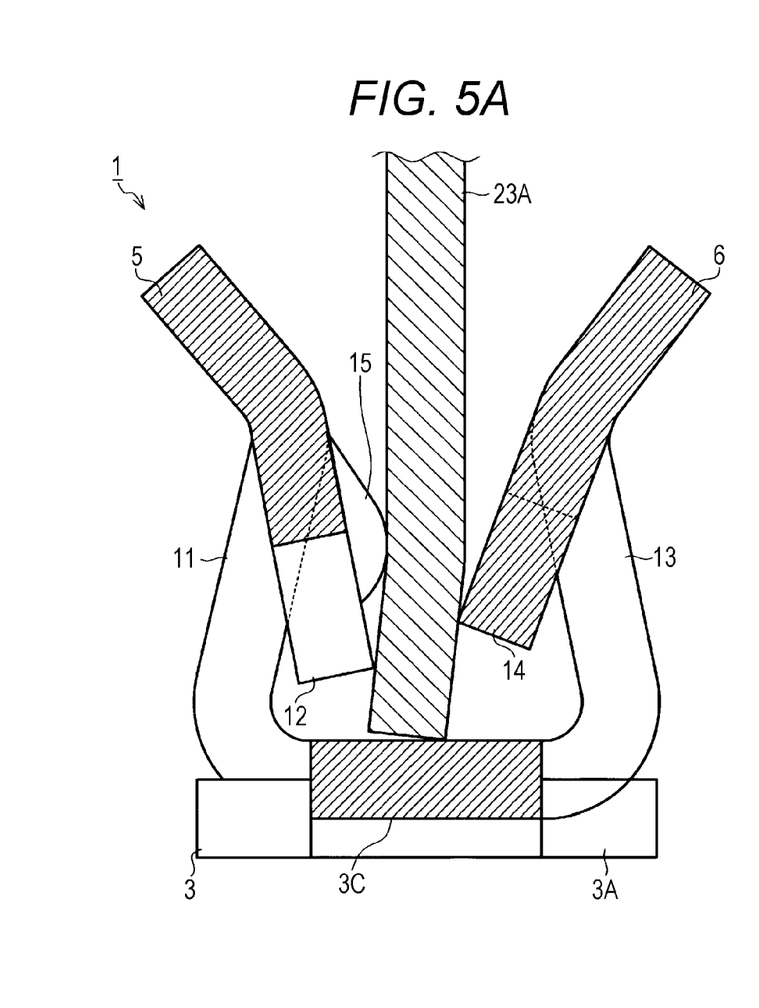
FIGS. 5A and 5B are explanatory diagrams illustrating the state in which a shield case of the embodiment is deformed.
Figure 5B:
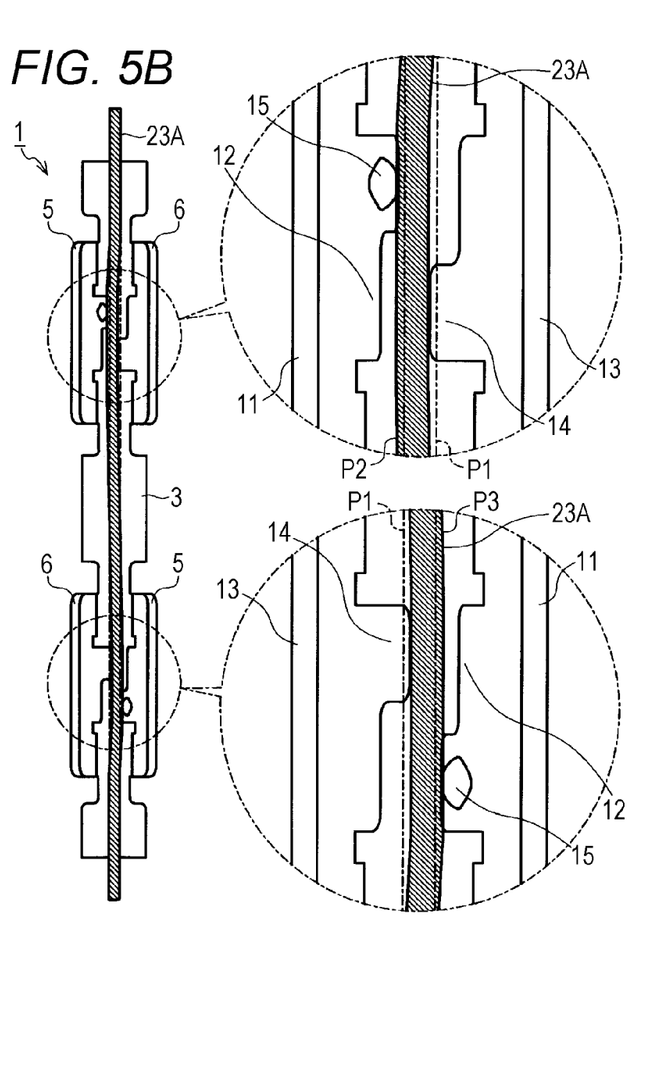

The above usage example (No. 1) has described the case in which the distal end of the fourth spring portion 14 is inserted into the hole 23B of the shield case 23. However, whether the hole 23B is disposed in the shield case 23 or not may be determined arbitrarily. FIG. 5A and FIG. 5B are explanatory diagrams in which the shield case 23 is not provided with the hole 23B.

In this case, when the plate-like portion 23A of the shield case 23 is inserted between the second spring portion 12 and the fourth spring portion 14, the convex portion 15 of the second spring portion 12 and the distal end of the fourth spring portion 14 are brought into press-contact with the plate-like portion 23A respectively. On this occasion, the convex portion 15 is in press-contact with the distal end of the fourth spring portion 14. The plate-like portion 23A is pushed toward the grip portion 6 at a height near the convex portion 15. Moreover, the plate-like portion 23A is pushed toward the grip portion 5 at a height near the distal end of the fourth spring portion 14.

Therefore, unlike in a case where the plate-like portion 23A is held between its front and back sides at the same height, a distortion as waving vertically occurs in the plate-like portion 23A because the plate-like portion 23A is partially bent as illustrated in FIG. 5A for example. Therefore, if the distortion as above occurs in the plate-like portion 23A, it becomes difficult to pull out the plate-like portion 23A from the grip member 1 as compared to a case in which a flat plate-like portion without the distortion is gripped.

In the example illustrated in FIG. 5A, the fourth spring portion 14 is present closer to a lower end of the plate-like portion 23A than the convex portion 15. Therefore, the lower end of the plate-like portion 23A is pushed toward the grip portion 5 with a deformation. As a result, in FIG. 5A, the lower end of the plate-like portion 23A is displaced in the leftward direction.

However, the grip member 1 comprises two pairs of grip portions 5, 6, 5, and 6. As already described, the grip portions have the rotation-symmetric shape: the shape that remains the same even after being rotated by half (180°) horizontally. Therefore, as illustrated in FIG. 5B, the lower end of the plate-like portion 23A includes an area that is distorted toward a position P2 more on the left side than a position P1 where the distortion does not occur and an area that is distorted toward a position P3 more on the right side than the position P1. Accordingly, a distortion as waving horizontally occurs in the plate-like portion 23A in addition to the distortion as waving vertically. This is also one reason why it becomes difficult to pull out the shield case 23 from the grip member 1.

[Effect]

According to the grip member 1 described above, the second spring portion 12 and the fourth spring portion 14 are in contact with the shield case 23 at vertically displaced positions. Therefore, as compared to a case in which the two spring portions are in contact with the shield case 23 at positions not displaced vertically, the plate-like portion 23A is bent in vertically different directions. The distortion as waving vertically is easily caused in the plate-like portion 23A. As a result, as compared to the case in which the shield case 23 is gripped in the flat plate-like portion 23A without the distortion, the shield case 23 is pulled out from between the paired grip portions 5 and 6 less easily. This can increase the operation of suppressing the displacement of the shield case 23.

If a hole is provided for the shield case 23 at any one of the contact areas that are displaced vertically and only one of the second spring portion 12 and the fourth spring portion 14 is hooked in the hole of the shield case 23 while the other is brought into press-contact with the plate-like portion 23A of the shield case 23, the operation of suppressing the displacement of the shield case 23 can be further increased.

Moreover, in the case of this grip member 1, both the second spring portion 12 and the fourth spring portion 14 extend obliquely downward from the base end side. The extension direction is a direction where the parts closer to the distal ends of the portions are approaches each other. Therefore, when a force acts upon the shield case 23 held between the second spring portion 12 and the fourth spring portion 14 in a direction where the shield case 23 is pulled out from between the both, a component of friction force acting between the shield case 23 and each of the second spring portion 12 and the fourth spring portion 14 acts in a direction where the second spring portion 12 and the fourth spring portion 14 on both sides of the plate-like portion 23A are respectively attracted toward the plate-like portion 23A. Therefore, in a case where the shield case 23 is displaced in a direction where the shield case 23 is pulled out from between the paired grip portions 5 and 6, the press-contact force of the second spring portion 12 and the fourth spring portion 14 (i.e., the gripping force by the pair of grip portions 5 and 6) tends to increase. This can increase the operation of suppressing the displacement of the shield case 23.

In the case of the grip member 1, the second spring portion 12 is provided with the convex portion 15. Therefore, a force acting on the shield case 23 from the second spring portion 12 concentrates on the convex portion 15. As compared to a case in which the convex portion 15 does not exist, the plate-like portion 23A of the shield case 23 is more firmly pressed toward the grip portion 6. As a result, the fourth spring portion 14 tightly fits in the contact area with the plate-like portion 23A. This can increase the operation of suppressing the displacement of the shield case 23. Thus, it is possible to suppress that the shield case 23 is detached and that a rattling sound is generated.

According to the grip member 1 as above, the second spring portion 12 with the convex portion 15 is in contact with a position at which the second spring portion 12 is above the fourth spring portion 14. Therefore, the fourth spring portion 14 is in contact with an area with lower rigidity. On the other hand, the second spring portion 12 with the convex portion 15 is in contact with an area with higher rigidity. Thus, the high press-contact force can be operated. Accordingly, the operation of suppressing the displacement of the shield case 23 can be increased.

In the grip member 1, the second spring portion 12 and the fourth spring portion 14 are provided with a part that is narrow in the width direction. Moreover, the parts are disposed not overlapping with each other when viewed from the direction perpendicular to the plate-like portion 23A. Therefore, even when the second spring portion 12 and the fourth spring portion 14 are molded by pressing for example, the portions can be bent largely without having the parts that are narrow in the width direction interfering with each other. Accordingly, as compared to a case in which the second spring portion 12 and the fourth spring portion 14 are disposed so that the distal ends thereof overlap with each other when viewed from the direction perpendicular to the plate-like portion 23A, the press-contact force of the second spring portion 12 and the fourth spring portion 14 relative to the plate-like portion 23A (gripping force of the pair of grip portions 5 and 6) can be increased. This can increase the operation of suppressing the displacement of the shield case 23.

In the grip member 1, the second spring portion 12 and the fourth spring portion 14 can be formed by the cutting and raising process. Therefore, the second spring portion 12 and the fourth spring portion 14 have the smaller structure as compared to a spring piece having a structure in which an extension piece extending upward from the base end is folded back obliquely downward in the middle. In addition, the structure of the grip member 1 can be further reduced in size.

According to the grip member 1 as above, the distal end of the fourth spring portion 14 reaches the position closer to the first spring portion 11 than the intermediate position between the first spring portion 11 and the third spring portion 13 over the intermediate position. Thus, the press-contact force of the fourth spring portion 14 can be increased as compared to a case in which the distal end of the fourth spring portion 14 exists before the intermediate position as above. This can increase the operation of suppressing the displacement of the shield case 23. Moreover, if the structure is employed in which the hole 23B is provided for the shield case 23 and the distal end of the fourth spring portion 14 is hooked in the hole 23B of the shield case 23, the fourth spring portion 14 is easily hooked in the hole 23B as long as the distal end of the fourth spring portion 14 reaches a position close to the first spring portion 11. This can further increase the operation of suppressing the displacement of the shield case 23.

Another Embodiment

One exemplary embodiment of the present invention has been described. The present invention is, however, not limited to the above exemplary embodiment. The present invention can be implemented in other various modes.

For example, in the above embodiment, the second spring portion 12 is provided with the convex portion 15. However, the provision of the convex portion 15 is optional. More specifically, a grip member 31 illustrated in FIG. 6 for example, has a structure in which the convex portion 15 is omitted from the above grip member 1. The grip member 31 has the same structure as the grip member 1 except the convex portion 15.

Figure 6:
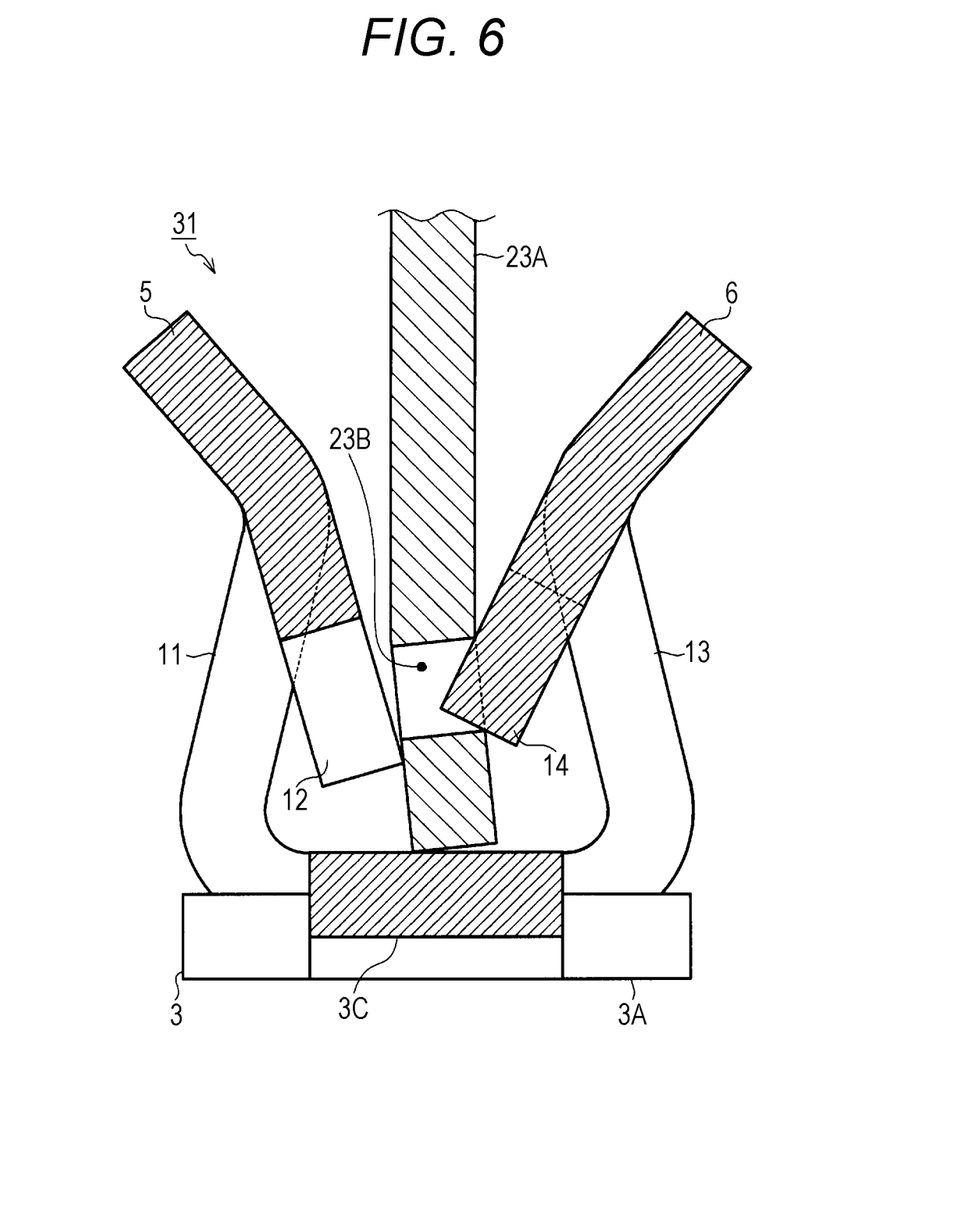
FIG. 6 is an explanatory view illustrating a grip member without a convex portion.

In a case of the grip member 31, the second spring portion 12 with larger spring length than the fourth spring portion 14 is in contact with the plate-like portion 23A of the shield case 23 at a position below the fourth spring portion 14 in the vertically direction. In other words, even in a case where the convex portion 15 is not provided, the parts of the second spring portion 12 and the fourth spring portion 14 are in contact with the shield case 23 in at least vertically different positions.

In this case, the lower end of the second spring portion 12 presses the plate-like portion 23A toward the grip portion 6. Here, if the plate-like portion 23A is configured so that the plate-like portion 23A is bent to some extent, the lower end of the plate-like portion 23A is bent toward the grip portion 6. Accordingly, a part of an opening periphery of the hole 23B is pressed against a lower end surface of the fourth spring portion 14. In other words, the plate-like portion 23A is bent with a force from the second spring portion 12. This can eliminate a space formed between the fourth spring portion 14 and the opening periphery of the hole 23B. This can increase the operation of suppressing the displacement of the shield case 23.

Therefore, the operation of suppressing the displacement of the shield case 23 can be increased either in the case where the above convex portion 15 is provided (see FIG. 4B) or the case where the convex portion 15 is not provided (see FIG. 6). However, the force acting on the shield case 23 from the second spring portion 12 becomes larger when the convex portion 15 is provided. If the firm fixture is desired, the provision of the convex portion 15 is effective. This can increase an effect of suppressing the rattling sound.

In addition, in the above embodiment, each of the six sides of the shield case 23 whose shape seems to be hexagonal in plan view is held by one or more grip members 1 in the example illustrated in FIG. 3. However, whether all the six sides are held by the grip members 1 may be determined arbitrarily. For example, the grip member 1 may be provided not for one or more sides, such as a relatively short side, but for the other side to thereby grip the shield case 23. Alternatively, a particular side may be bonded or attached to the printed wiring board 21 through another means instead of using the grip member 1. For example, a part of the shield case 23 may be fixed to the printed wiring board 21 by soldering. Further alternatively, a part of the shield case 23 may be fixed to the printed wiring board 21 with a screw. These fixing methods can be employed in combination with the grip member 1.

The number of grip members 1 to be disposed for the respective sides may be determined arbitrarily. For example, more grip members 1 than the example illustrated in FIG. 3 may be provided. Alternatively, less grip members 1 than the example illustrated in FIG. 3 may be provided. In the example illustrated in FIG. 3, the plural grip members 1 have the same shape. However, a grip member with different size and shape may be used in combination.

Moreover, in the above embodiment, one grip member 1 comprises four grip portions 5, 6, 5, and 6 and each two of the four grip portions 5, 6, 5 and 6 forms a pair. However, the number of grip portions and the number of pairs formed by the grip portions may be determined arbitrarily. For example, the grip member may have one pair of grip portions 5 and 6, or may have six or more grip portions 5, 5, . . . 5 and 6 forming three or more pairs. As long as at least one or more pairs of grip portions satisfy the structure of the present invention, a grip portions with a structure different from that of the present invention may be provided additionally.

The invention claimed is:

1. A grip member comprising:
a base portion; and
one or more pairs of grip portions, wherein:
the base portion comprises a joint surface to be soldered to a conductor portion of a printed wiring board;
each of the one or more pairs of grip portions extends from the base portion and is configured to be elastically deformable;
the one or more pairs of grip portions, in a case that a plate-like portion as a part of a shield case is disposed perpendicular to the printed wiring board when the shield case is disposed at a position where the shield case covers an electronic component mounted on the printed wiring board, are configured to bring the plate-like portion into a state of being gripped by bringing at least one grip portion into press-contact with one surface of opposite surfaces of the plate-like portion and bringing at least one grip portion into press-contact with the other surface;
of one and the other of the pair of grip portions, the one grip portion comprises a first spring portion and a second spring portion;
the first spring portion is formed into a shape that extends in a direction apart from the base portion ranging from a base end integrally formed on the base portion to a distal end of the first spring portion;
the second spring portion is formed into a shape that extends in a direction approaching the base portion ranging from a base end integrally formed on the first spring portion to a distal end and a shape that a part closer to the distal end of the second spring portion is closer to the other grip portion;
the other grip portion comprises a third spring portion and a fourth spring portion;
the third spring portion is formed into a shape that extends in a direction apart from the base portion ranging from a base end integrally formed on the base portion to a distal end;
the fourth spring portion is formed into a shape that extends in a direction approaching the base portion ranging from a base end integrally formed on the third spring portion to a distal end and a shape that a part closer to the distal end of the fourth spring portion is closer to the one grip portion; and
the second spring portion and the fourth spring portion are configured to be able to grip the shield case by holding the shield case between the second spring portion and the fourth spring portion and to be in contact with the shield case at different positions in regard to at least a direction orthogonal to the joint surface when the shield case is gripped.

2. The grip member according to claim 1, wherein:
the second spring portion comprises a convex portion protruding in a direction close to the other grip portion; and the convex portion is configured to be brought into contact with the shield case when the shield case is gripped between the second spring portion and the fourth spring portion.

3. The grip member according to claim 2, wherein:
the convex portion is configured to be brought into contact with the shield case at a position more apart from the joint surface as compared to a contact position between the fourth spring portion and the shield case in regard to at least the direction orthogonal to the joint surface when the shield case is gripped between the second spring portion and the fourth spring portion.

4. The grip member according to claim 1, wherein:
the second spring portion and the fourth spring portion comprises a part with larger length in a width direction, which is orthogonal to both an extension direction and a thickness direction, on a base end side than on the distal end side and a part with smaller length in the width direction on the distal end side than on the base end side; and
the parts with the larger length in the width direction are disposed to face each other with the plate-like portion interposed therebetween and the parts with the smaller length in the width direction are disposed not overlapping with each other when viewed from a direction perpendicular to the plate-like portion.

5. The grip member according to claim 1, wherein:
the second spring portion is formed by cutting and raising a part of the first spring portion in a lingular shape; and
the fourth spring portion is formed by cutting and raising a part of the third spring portion in a lingular shape.

6. The grip member according to claim 1, wherein the distal end of the fourth spring portion reaches a position closer to the first spring portion than an intermediate position between the first spring portion and the third spring portion over the intermediate position in a state viewed from a direction parallel to both the plate-like portion and the printed wiring board.

7. The grip member according to claim 1, wherein the fourth spring portion functions as a pull-out inhibitor piece that is configured to inhibit the shield case from being pulled out from between the paired grip portions by being hooked in a hole provided for the shield case.

8. The grip member according to claim 2, wherein:
the second spring portion and the fourth spring portion comprises a part with larger length in a width direction, which is orthogonal to both an extension direction and a thickness direction, on a base end side than on the distal end side and a part with smaller length in the width direction on the distal end side than on the base end side; and
the parts with the larger length in the width direction are disposed to face each other with the plate-like portion interposed therebetween and the parts with the smaller length in the width direction are disposed not overlapping with each other when viewed from a direction perpendicular to the plate-like portion.

9. The grip member according to claim 2, wherein:
the second spring portion is formed by cutting and raising a part of the first spring portion in a lingular shape; and
the fourth spring portion is formed by cutting and raising a part of the third spring portion in a lingular shape.

10. The grip member according to claim 2, wherein the distal end of the fourth spring portion reaches a position closer to the first spring portion than an intermediate position between the first spring portion and the third spring portion over the intermediate position in a state viewed from a direction parallel to both the plate-like portion and the printed wiring board.

11. The grip member according to claim 3, wherein:
the second spring portion and the fourth spring portion comprises a part with larger length in a width direction, which is orthogonal to both an extension direction and a thickness direction, on a base end side than on the distal end side and a part with smaller length in the width direction on the distal end side than on the base end side; and
the parts with the larger length in the width direction are disposed to face each other with the plate-like portion interposed therebetween and the parts with the smaller length in the width direction are disposed not overlapping with each other when viewed from a direction perpendicular to the plate-like portion.

12. The grip member according to claim 3, wherein:
the second spring portion is formed by cutting and raising a part of the first spring portion in a lingular shape; and
the fourth spring portion is formed by cutting and raising a part of the third spring portion in a lingular shape.

13. The grip member according to claim 3, wherein the distal end of the fourth spring portion reaches a position closer to the first spring portion than an intermediate position between the first spring portion and the third spring portion over the intermediate position in a state viewed from a direction parallel to both the plate-like portion and the printed wiring board.

* * * * *